United States Patent
Vig

[11] Patent Number: 5,451,425
[45] Date of Patent: Sep. 19, 1995

[54] PROCESS FOR SETTING THE FREQUENCY OF A SILICON MICRORESONATOR

[75] Inventor: John R. Vig, Colts Neck, N.J.

[73] Assignee: The United States of America as represented by the Secretary of the Army, Washington, D.C.

[21] Appl. No.: 308,110

[22] Filed: Sep. 13, 1994

[51] Int. Cl.[6] .............................................. B05D 5/12
[52] U.S. Cl. ........................................ 427/8; 427/99; 427/255; 427/255.4; 427/399; 427/583; 427/595
[58] Field of Search ...................... 427/8, 583, 595, 96, 427/99, 255, 399, 255.4

[56] References Cited
PUBLICATIONS

Clark T. -C. Nguyen and Roger T. Howe, "Design and Performance of CMOS Micromechanical Resonator Oscillators," 1994 IEEE International Frequency Control Symposium (No Month Available).

Roger T. Howe, "Applications of Silicon Micromachining to Resonator Fabrication," 1994 IEEE International Frequency Control Symposium (No Month Available).

*Primary Examiner*—Bernard Pianalto
*Attorney, Agent, or Firm*—Michael Zelenka; John M. O'Meara

[57] ABSTRACT

A silicon chip which is used as a microresonator, filter or the like and which may include an integrated circuit, has its resonant frequency adjusted by increasing its thickness in an ozone-rich atmosphere which may be supplemented by ultraviolet light and/or heat. The process lends itself to low cost, mass production techniques.

9 Claims, 1 Drawing Sheet 5,451,425

PROCESS FOR SETTING THE FREQUENCY OF A SILICON MICRORESONATOR

GOVERNMENT INTEREST

The invention described herein may be manufactured, used, and licensed by or for the Government of the United States of America without the payment to me of any royalty thereon.

BACKGROUND OF THE INVENTION

This invention relates to silicon microresonators, and more specifically to a novel process for accurately setting the frequency of oscillation of microresonators.

DESCRIPTION OF THE PRIOR ART

Silicon microresonators are being developed for use with oscillator circuits, filter circuits and as sensors. The techniques presently known for setting their resonant frequency of oscillation do not lend themselves to high accuracy and low-cost mass production. Silicon microresonator technology is well known. Recent activity in this technology was disclosed during the 1994 IEEE International Frequency Control Symposium at which papers were presented by Roger T. Howe entitled "Applications of Silicon Micromachining to Resonator Fabrication" and by Clark T. C. Nguyen and Roger T. Howe entitled "Design and Performance of CMOS Micromechanical Resonator Oscillators". Howe disclosed that silicon micromachining is a rapidly maturing technology that has great potential for frequency control applications; that silicon microresonator frequency adjustment will be necessary for these applications to be practical; and that a polysilicon lateral resonator can be fabricated to within around 1% of its design frequency. For frequency adjustment, Howe disclosed the use of fusing, welding, or electrical adjustment.

To illustrate the critical importance of frequency adjustment, consider one of the major frequency control applications of resonators, i.e., clocks. As there are 86,400 seconds in a day, if the frequency of a resonator in a clock was in error by 1%, time errors would accumulate at a rate of $86,400 \times 0.01 = 864$ seconds per day, i.e., the clock's inaccuracy would be more than 14 minutes per day. This would clearly be unacceptable. As modern quartz clocks are typically accurate to better than one second per day, in order to be competitive with the quartz resonators, silicon microresonators' frequency would need to be adjusted to better than 1 part in 86,400, i.e., to better than 10 parts per million (ppm).

It is known to adjust the frequency of a quartz resonator by treating the quartz resonator's electrodes with ozone in the presence of ultraviolet (UV) light to controllably grow an oxide on the exposed electrode surfaces. This procedure slowly alters the resonant frequency of the resonant oscillator until a given frequency is obtained by measuring equipment which may remain in place during the UV/ozone process.

This process is described in my prior U.S. Pat. No. 4,638,536, entitled "Method of Making a Resonator Having a Desired Frequency From a Quartz Crystal Resonator Plate", issued Jan. 27, 1987.

The UV/ozone process is generally well known, and is described, for example, in the Handbook of Semiconductor Wafer Cleaning Technology, edited by Werner Kern, 1993, Noyes Publications of Park Ridge, N.J. Chapter 6. As disclosed in this foregoing reference, the UV/ozone process used in the present invention for adjustment of quartz resonators is also useful for the etching and ultra-cleaning of silicon wafer surfaces. However, no references are known which disclose or suggest fixing the frequency of silicon resonators by using the UV/ozone cleaning process for silicon, and such frequency fixing is a problem which has confronted silicon microresonators for a number of years.

BRIEF SUMMARY OF THE INVENTION

In accordance with the present invention, a UV/ozone operation is applied to a microminiature silicon resonator which may or may not have integrated circuits included therein, using a UV/ozone treatment which adjusts the silicon resonator dimensions to correspondingly adjust its resonant frequency until a given resonant frequency is reached. Unlike the UV/ozone treatment of quartz resonators, during which the quartz is not affected, in the UV/ozone treatment of silicon resonators, the silicon is affected, i.e., its mass increases through the formation of silicon oxides on its surfaces.

Thus, when one cleans silicon with UV/ozone, one of the side effects is the enhanced growth of the oxide. Since the microresonator is extremely sensitive to added mass, if the resonator is designed for a frequency just slightly above the target frequency, then one can adjust the frequency to the target by exposing the resonator to ozone and to a short wavelength UV lamp while monitoring the frequency, and then cutting off the UV and ozone at the desired frequency. Of course, one could adjust an array of resonators to a variety of frequencies by varying the exposure conditions.

A major advantage of the method is that it is a dry, inexpensive, and in-situ process which could be easily adopted to automated production. All the resonators could start at about the same frequency, then end up either at the same target frequency, or each at a different frequency (e.g., for filters). The process may be carried out at room temperature, without any heating, for small to medium frequency adjustment ranges. Heating the resonators would enhance the oxidation rates for larger adjustments. The process does not affect gold or gold plated terminal connectors, whereby the resonant frequency of the chip being adjusted can be monitored and the treatment discontinued when the desired frequency or other electrical characteristic is obtained. Such a process lends itself to low cost mass production techniques.

It is also possible, in accordance with the invention, to adjust the frequency of a silicon resonator using ozone alone, without UV light, or to use a separate ozone generator to increase the amount of atomic oxygen available for oxidation of the silicon. Thus, atomic oxygen, the essential ingredient in growing enhanced oxides on silicon, can be produced in larger quantities by means of an ozonizer that generates ozone via a high voltage, than with one that relies on UV light only. For example, a barrier discharge ozonizer employs an AC voltage of several kilovolts which is applied across dielectric coated electrodes. Oxygen is passed between the electrodes. The voltage drives an avalanche of electrons across the gap between the electrodes which breaks the $O_2$ bonds, to produce atomic oxygen. Other configurations of ozone generators, e.g., the "silent discharge" generator, are also suitable. Ozone generators which employ high voltage can produce ozone concentrations greater than 20,000 ppm (2%), much more than can be produced by UV light. An oxide layer of about 0.9 nanometers (nm) thickness forms on silicon naturally, just due to exposure to air. When such an oxidized surface was exposed to UV/ozone for ten minutes, the oxide layer increased to a thickness of 1.2 nm. Under exposure to high concentration ozone, the oxide thickness can be made to exceed 4 nm.

DETAILED DESCRIPTION OF THE DRAWINGS

Figure 1:
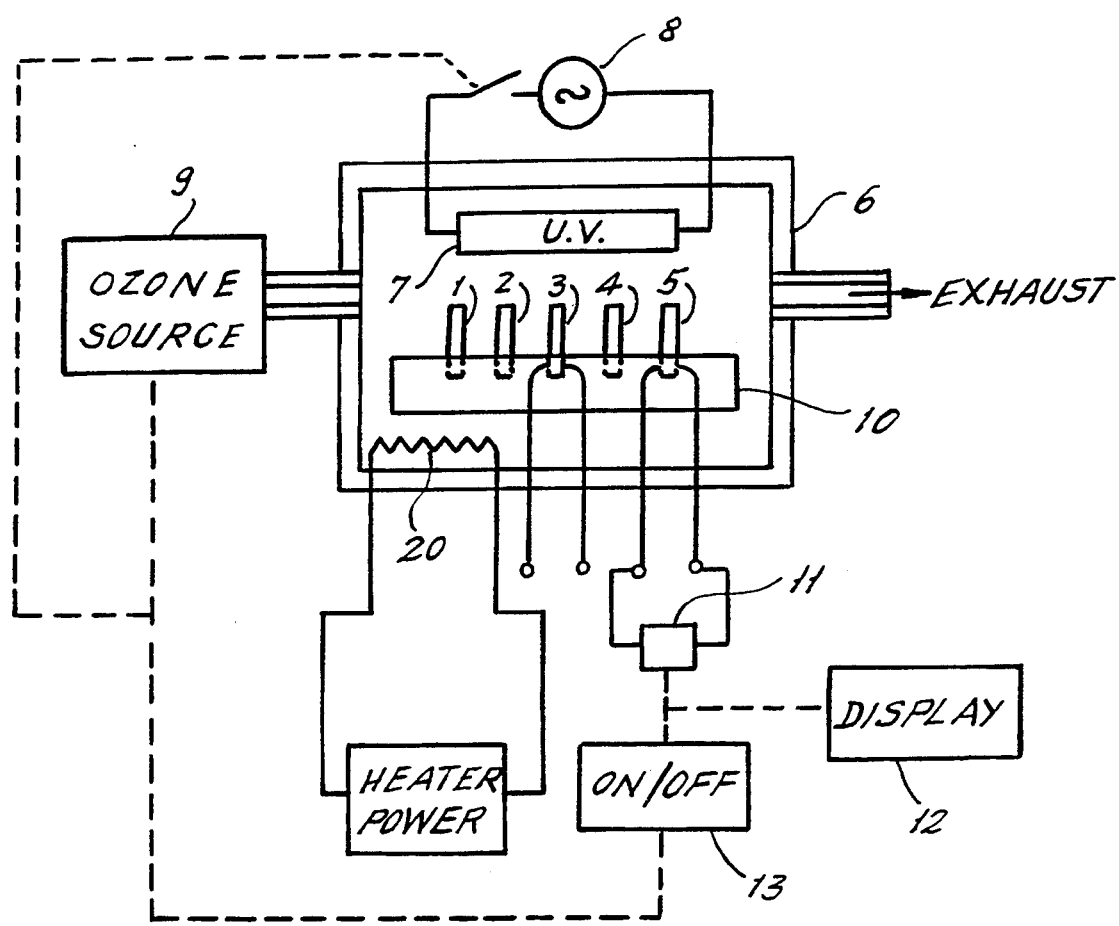
FIG. 1 is a schematic diagram of the apparatus which can be used in carrying out the process of the present invention.

The FIG. 1 schematically shows the manner in which the present invention can be used to adjust the resonant frequencies of a plurality of microminiature microresonators.

A typical silicon microresonator is about 2 micrometers (i.e., 2,000 nm) thick, and about 100 kHz in frequency. Although the frequency dependence on resonator mass is a function of resonator configuration, generally, increasing the mass results in a decrease in the frequency. As the frequency of the resonator varies inversely with its mass, i.e., with its thickness, if the other dimensions remain constant, as the microresonator is exposed to UV/ozone (or to just ozone), the frequency is lowered due to the extra mass created by oxidation. To illustrate the effect, we assume that the frequency change is proportional to thickness change. Each 0.1 nm of additional thickness then lowers the frequency by about 1 part in 20,000, i.e., by 50 ppm (neglecting density differences between the silicon and the oxide). As the oxide thickness grows at a rate of about 0.03 nm per minute under UV/ozone exposure, the frequency changes at a rate of about 0.3 ppm per second. The rate can be lowered, if necessary, by placing the microresonators further from the UV lamp so as to lower the ozone concentration. In this manner, the frequency of a microresonator can be adjusted to the desired value with a very high accuracy.

A plurality of such silicon resonators 1, 2, 3, 4 and 5 can be mounted on a common fixture 10 and can be plugged into test resonator circuits such as circuit 11 which provides the drive power and measures the resonating frequency. The fixture 10 is placed in a closed box 6 which contains a wavelength UV lamp or lamps 7, powered from source 8. An ozone source 9 is connected to box 6. A display 12 can present the measured frequency and an on/off circuit 13 can turn off ozone flow and the UV lamp or lamps when at least a given plurality of resonators are within an acceptable band of resonant frequencies. A heater 20 may also be provided in box 6 to increase the oxidation rate and the rate at which the frequency of resonators 1 to 5 changes.

In one embodiment of the invention, ozone and UV are simultaneously applied to the silicon resonator samples. However, ozone alone may be used. For example, ozone source 9 may be an OREC CDM-OT Series Ozone Catalytic Destruct Module made by Ozone Research & Equipment Corporation of Phoenix, Ariz. having a flow rate of 50 to 100 SCFM. The tubing or duct work connecting source 9 to box 6, and box 6 itself may be of aluminum and need not be air tight. (Operator exposure to ozone and UV must be prevented, however, for safety reasons.)

In operation, each of the microresonators are roughly fabricated to above their target frequency. They are then exposed in box 6 to UV light and ozone until their resonant frequency is reached. Those devices reaching resonant frequency may be removed by the operator and the others continue to be processed.

Furthermore, it is possible in one embodiment of the invention to expose the silicon to ozone alone. In one 30 minute experiment, an oxide layer on a silicon wafer grew to a thickness of more than 10 nanometers when exposed to an ozone atmosphere at 500° C. vs. a thickness of only 2 nanometers at the same temperature when exposed to $O_2$ for 30 minutes.

Fine tuning of individual resonators to the desired frequency, or frequencies, may be performed by directing ozone through fine tubes (not shown) to individual resonators and cutting off the flows as each of the resonators reaches the desired frequency. The desired frequencies may or may not be the same for all the resonators. For example, for filter applications, the resonators can be tuned to different frequencies. Yet another way to fine tune the resonators is to expose the resonators to UV light through individual shutters (not shown), and to close the shutters as the resonators reach the desired frequency.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What I claim is:

1. Process for fixing the resonant frequency of a silicon microresonator body which consists of a thin chip of silicon which resonates at a frequency which is at least partly related to the thickness of the chip which comprises the steps of:

forming said chip to an initial thickness; attaching resonant frequency monitoring means to said chip; exposing said chip to an ozone-rich atmosphere to cause growth of oxide on said chip to cause a change in the resonant frequency of said chip until the resonant frequency is reached, and then removing said chip from said ozone-rich atmosphere.

2. The process of claim 1 wherein said process is carried out at room temperature.

3. The process of claim 1 wherein said chip includes an integrated circuit.

4. The process of claim 1 which further includes the application of ultraviolet light to said chip when said chip is in said ozone-rich atmosphere.

5. The process of claim 4 wherein said process is carried out at room temperature.

6. The process of claim 4 wherein said chip includes an integrated circuit.

7. The process of claim 1 which further includes the heating of said atmosphere of ozone above room temperature.

8. The process of claim 7 wherein said chip includes an integrated circuit.

9. The process of claim 7 which further includes the application of ultraviolet light to said chip when said chip is in said ozone-rich atmosphere.

* * * * *